June 17, 1969 J. C. TSAI 3,450,963

FIELD EFFECT SEMICONDUCTOR DEVICES OF THE JUNCTION TYPE AND METHOD OF MAKING

Filed Dec. 30, 1966

WITNESSES:

Leon M. Garman

James F. Young

INVENTOR

Joseph C. Tsai

BY

Gordon H. Telfer

ATTORNEY

United States Patent Office 3,450,963

Patented June 17, 1969

3,450,963

FIELD EFFECT SEMICONDUCTOR DEVICES OF THE JUNCTION TYPE AND METHOD OF MAKING

Joseph C. Tsai, Sinking Spring, Pa., assignor to Westinghouse Electric Corporation, Pittsburgh, Pa., a corporation of Pennsylvania Filed Dec. 30, 1966, Ser. No. 606,180
Int. Cl. H01l *11/00, 11/14;* H03k *23/22*
U.S. Cl. 317—235 4 Claims

ABSTRACT OF THE DISCLOSURE

Junction type field effect devices, also known as unipolar devices, that have their principal regions, channel and gate, laterally disposed with respect to each other are disclosed. Included are complex structures wherein such unipolar devices are integrated with other elements and methods of fabrication including utilization of selective diffusion laterally under a diffusion mask.

CROSS REFERENCE TO RELATED APPLICATION

This application is related in subject matter to copending application Ser. No. 511,439, filed Dec. 3, 1965, that discloses and claims the distinct invention of H. C. Lin and E. A. Karcher and is assigned to the assignee of the present invention.

BACKGROUND OF THE INVENTION

*Field of the invention*

Junction type field effect semiconductor devices, also called unipolar devices or unipolar transistors, are basically known types of devices that are characterized by a first region called the channel through which a current path is modulated by reason of signals applied to a second region called the gate this is in p-n junction relationship with the first region. Such devices are made and used as single elements and are also made and used as elements in complex structures such as semiconductor integrated circuits wherein a plurality of similar or different elements are formed within a body of semiconductor material.

*Description of the prior art*

It has been generally known what types of electrical characteristics are desirable for unipolar transistors and how different structural features affect these characteristics. In general, for example, it is known that it is desirable for the channel region to be narrow, that is, have small dimensions in a cross-section perpendicular to the current path, and that it be of relatively high resistivity material. These features enable pinch-off, that is, minimization of current flow, at a low value of applied gate voltage. A continuing problem has been however to provide a structure having these desirable features that is readily and reproducibly fabricated. In integrated circuits it is further necessary that the fabrication scheme fit in with the overall fabrication of the integrated circuit so that other types of elements are not adversely affected by the use of techniques desirable for the unipolar transistor.

One of the simplest and most widely used prior art techniques for forming unipolar devices is by the successive diffusion of channel and gate regions into a substrate of opposite conductivity type to the channel region. Such double diffused devices are readily formed by existing technology, they are not however as readily reproduced as desired nor do they offer as good channel characteristics as are desired. The resulting impurity concentration gradient in the channel region and the inherent lack of precise control of diffused junction depth make it difficult to achieve both a narrow channel and one having low impurity concentration. If, in order to improve the resistivity, a higher resistivity substrate is used, such a technique may not be suitable for integrated circuit fabrication because of difficulty in forming other elements such as bipolar transistors with good characteristics. It is also desirable to maximize the reverse breakdown voltage of the gate junction.

Various workers in the field have proposed alternatives to the conventionally used double diffused devices. Representative of them is that disclosed in the above-referred to copending application, and the literature reference cited therein, wherein diffusion of the gate region is performed in non-compensated material and lateral diffusion is utilized to define a channel of small cross-sectional dimensions. By that structure and technique only one contact to the channel region is formed within the portion of narrow cross-section. The current path thus extends vertically within the structure. Alternatives that provide lateral current paths and simpler fabrication are desirable.

SUMMARY OF THE INVENTION

This invention permits the utilization of lateral diffusion to form a restricted channel region, that channel region is in the surface of the device not requiring the current path extend through the substrate in vertical directions. The channel region is of essentially uniform resistivity and non-compensated. The gate region of opposite type material is compensated and surrounds the channel region in all directions parallel to the plane of the surface of the device, with the material of the gate region immediately adjacent the channel region having a doping impurity concentration gradient that is lateral.

Contacts are provided to extremities of the channel region to serve as source and drain contacts and are both disposed on the portion surrounded by the gate region. Another electrical contact is provided on the gate region to serve as a gate contact. It is desirable that the channel region be of an elongated configuration with a width over a major portion of its length of less than about 10 microns with enlarged portions at its extremities for the disposition of the first and second for source and drain contacts. Thus a "dumbell" configuration is suitable. The length of the elongated channel region is determined by pinch-off current considerations.

To facilitate completing the diffusion of the gate region, the original material from which the channel if formed is disposed on an opposite type substrate. This substrate may be used to support other elements in an integrated circuit utilizing an epitaxial layer from which the channel is formed for forming other device elements with additional layers or regions as are necessary or desirable to achieve both the desired element configuration and desired internal isolation.

In the method of this invention a diffusion mask is formed on the surface of the material from which the channel is to be formed. The mask includes a portion having an elongated configuration. Diffusion is performed to convert material under the mask portion, by reason of impurities laterally diffusing therein so that the elongated surface portion of noncompensated material is reduced by at least about half in width. Thus, the present invention takes advantage of lateral diffusion to avoid the limits on conventional photoresist processes by which diffusion masks are formed. It is relatively easy, for example, to form a mask with a portion having a width of about 25 microns, although substantially lesser width masks are difficult to form. As a result of the lateral diffusion, the resulting channel region can have a width of less than about 10 microns, such as 5 microns.

The invention therefore achieves the objects of providing a unipolar transistor structure having desirable channel characteristics both in dimension and resistivity but which may be readily and reproducibly formed.

BRIEF DESCRIPTION OF THE DRAWING

The invention will be better understood by referring to the following description taken with the accompanying drawing wherein.

DESCRIPTION OF THE PREFERRED EMBODIMENTS

Figure 2:
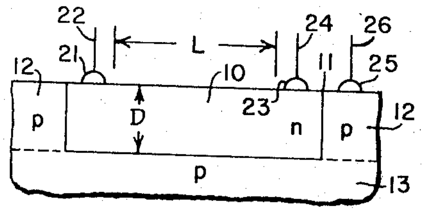
FIG. 2 is a cross-sectional view of the structure of FIG. 2 taken along the line II–II, with additional contacts and lead elements illustrated.
Figure 1:
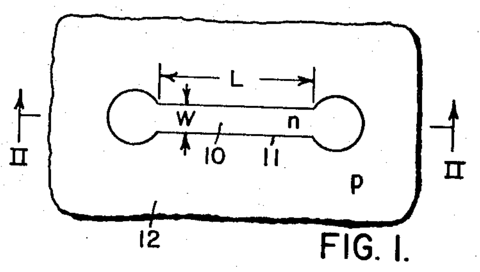
FIGURE 1 is a plan view of a unipolar transistor in accordance with this invention.

As illustrated in FIGS. 1 and 2, the first region 10 of n-type semiconductivity is surrounded by a second region 12 of p-type material forming a junction 11 therebetween that extends to a planar surface of the structure. The first region 10 is of an elongated configuration having enlarged portions at its extremities for formation of electrical contacts thereon to serve as source and drain contacts. The conductivity type of the various regions in the embodiments herein may be reversed from that shown.

In forming such a structure in silicon, other semiconductive materials also being suitable, by way of example, the substrate may be of commercial device quality material of p-type uniform doping to a relatively high resistivity of, for example, 10 ohm centimeters or more. An n-type epitaxial layer is grown on the surface of the substrate and may, for example, have a thickness within the range from about 7 microns to about 10 microns and a resistivity in the range of about 2 ohm centimeters to about 15 ohm centimeters. Generally a thin layer of high resistivity would be preferred for low pinch-off voltage.

A diffusion mask is formed on the surface of the n-type epitaxial layer. It may, for example, be of silicon dioxide formed by known photolithographic techniques. In the mask pattern would be a portion of elongated configuration extending over the position where the unipolar device channel region 10 is desired. That mask portion would be surrounded by a window through the mask. In diffusing an impurity capable of converting the conductivity type through the window, the gate region 12 is formed and the channel region 10 is defined. Lateral diffusion under the oxide strip of the diffusion mask restricts the channel width, W, dimension to less than that of the mask itself, and provides an impurity concentration gradient in that portion of the region 12 adjacent the junction 11. Thus, the restrictions on photoresist masks and, hence, diffusion masks do not prevent provision of a channel of narrow width, W, even without relying on vertical current flow.

For a 7 micron thick n-type epitaxial layer, for example, to diffuse with boron to a depth of about 10 microns so as to produce lateral diffusion all along the junction from the surface to the p-type substrate and thus, to define an essentially uniform channel width, W, regardless of the depth, D, from the planar surface. In diffusing 10 microns within the structure, there is diffusion of 10 microns on each side of the mask so that the total lateral diffusion under the mask will be 20 microns at the surface. If one desires an ultimate channel depth of 1 micron can be obtained, which is very good for unipolar purposes, then the oxide strip will be formed 25 microns wide. This dimension can be readily achieved by present photoresist techniques. With a n-type epitaxial layer having a resistivity of about 10 ohm centimeters, pinch-off voltages of about 3 volts may be obtained.

After the diffusion, during or after which the surface is reoxidized, windows are opened for applying the contacts 21 and 23 serving as source and drain contacts and contact 25 serving as the gate contact to which conductors 22, 24 and 26, respectively, are subsequently attached. The conductors 22, 24 and 26 may be formed by metallization during the formation of the contacts themselves and would ordinarily extend over the oxide layer surface particularly when the element is disposed within an integrated circuit. Thus the drawing is merely to indicate the nature of the elements and not their precise form in actual practice.

Structures as described have been fabricated and pinch-off voltages in the range of from about 3 to about 3.7 volts have been achieved with pinch-off currents in the range from about 0.018 milliampere to 0.045 milliampere for the smaller devices. Larger devices having a pinch-off voltage in the range of from about 8 to 12 volts with pinch-off current in the range of 0.1 to 0.3 milliampere have been formed. By connecting similar structures in parallel, the pinch-off current can be increased without increasing pinch-off voltage. Consistency of pinch-off characteristics between different devices is found to be better than in the case of double diffused unipolar transistors and fabrication control is found not to be as critical. Breakdown voltages of greater than 50 volts, considerably better than in double diffused structures, are achieved.

Figure 3:
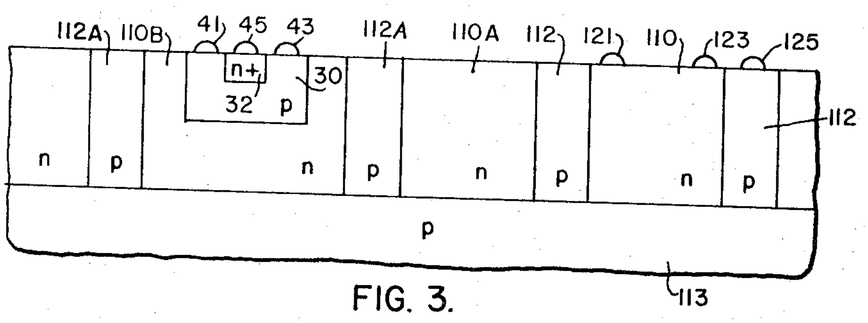
FIGS. 3 and 4 are partial cross-sectional views of semiconductor integrated circuit structures incorporating the unipolar device in accordance with this invention.

The structure of FIGS. 1 and 2 may be formed as part of an integrated circuit. FIG. 3 illustrates one such structure wherein the right-hand portion is a unipolar transistor in accordance with this invention with elements having reference numerals with the same last two digits as the corresponding elements of FIGS. 1 and 2. The p-type substrate 113 extends under a number of device elements. The n-type epitaxial layer from which the channel 110 is formed extends throughout the structure but is sub-divided by subsequent operations to separate and form individual devices. For example, the illustrated structure includes an isolation wall of p-type material 112A that may be formed in the same diffusion as for the gate 112. Region 110A of the n-type layer and isolation wall 112A entirely separates the unipolar device described from a pocket of n-type material 110B, in which may be disposed some other element.

Here illustrated by way of example, is a p-channel unipolar device formed by the double diffusion technique of the prior art and including p-type channel region 30 and an n-type gate region 32 with source and drain contacts 41 and 43 on the channel region and contact 45 on the gate region.

In some circuits it is desirable to have unipolar transistors of complementary type, that is one p-channel and one n-channel. Thus, where the problems in fabrication control of the double diffused structure may be tolerated, the present invention is still useful in providing a unipolar device of opposite type in the same structure.

In the illustrated structure of FIG. 3 it is seen that the isolation wall 112A is connected through substrate 113 to the gate region 112. This may be undesirable because the substrate is usually grounded. It would be preferred in some instances that the gate 112 not communicate with other portions of the structure.

Figure 4:
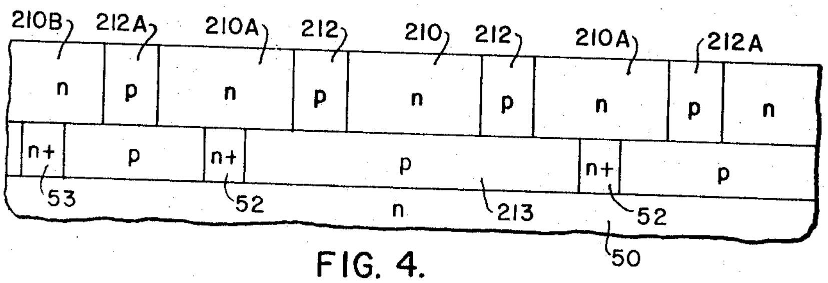

FIG. 4 provides an integrated structure with more effective isolation. Here elements have reference numerals with the same last two digits as the corresponding elements of FIG. 3. For convenience, contacts are omitted. The channel region 210 and gate region 212 are formed as before on a substrate 213. But this substrate 213 is now only an epitaxial layer on a supersubstrate of n-type material 50. Prior to the formation of the epitaxial layer from which the channel 210 is formed, diffused regions 52 of n-type conductivity are formed extending through the layer 213 and sub-dividing it into isolated portions.

After growth of the n-type layer, diffusion of the p-type regions is performed. The gate region 212 is confined over one of the isolated portions of layer 213. Other p-type isolation walls 212A separate the n-type epitaxial layer into isolated portions 210, 210A and 210B.

Thus, the present invention is a step forward in providing greater design flexibility not only in unipolar structures themselves, but in integrated circuits generally.

In the foregoing structure the epitaxial layer 213 may be very thin, such as only a few microns, so that the diffusion of regions 52 may be performed in the same operation in which the diffusion of regions in the position desired for bipolar transistors with low saturation resistance is performed, and thus would not add an additional diffusion step to the overall fabrication process. Isolated portion 210B would be suitable for fabrication of a transistor of the bipolar type and has sub-diffused n+ region 53 under it that may be formed with the regions 52.

Among various suitable modifications are that the thickness of the epitaxial layer from which the unipolar channel is formed may be enlarged to increase transconductance, $g_m$, because this will increase the ration of width to length of the channel.

In forming contacts 21 and 23 for the source and drain on the channel 10, or their equivalents in the various embodiments, it may be suitable to employ an n-type diffusion in the confined area in which the contacts are to be formed, as is usual in making contact to n-type conductivity material with a metal such as aluminum. In so doing, it is not critical that the n+ diffusion be confined within the n-type material since no adverse affects will result if it also contacts material of gate region 12.

Various modifications may be made in the embodiments specifically disclosed herein while still utilizing the present invention.

What is claimed is:

1. A semiconductor device of the junction-field effect type comprising:

- a first semiconductive region of a first conductivity type material that is of essentially uniform resistivity;
- a second semiconductive region of a second conductivity type material;

- said first and second regions forming a p-n junction terminating at a planar surface;
- said first region being surrounded by said second region in directions parallel to the plane of said surface;
- the material of said second region immediately adjacent said first region having a doping impurity concentration gradient in directions parallel to said planar surface;
- first and second electrical contacts to said first region on said planar surface to provide source and drain contacts;
- a third electrical contact to said second region to provide a gate contact.

2. The subject matter of claim 1 wherein: said first region has an elongated configuration with a width at said planar surface over a major portion of its length of less than about ten microns with enlarged portions in the positions of said first and second contacts.

3. The subject matter of claim 1 wherein: said first and second regions are disposed on a substrate of said second conductivity type of essentially uniform resistivity material.

4. The subject matter of claim 3 wherein: at least third and fourth regions of said first conductivity type, like said first region in thickness, resistivity, and impurity concentration profile, are also disposed on said substrate and are separated from each other by a fifth region of said second conductivity type like said second region in thickness, resistivity, and impurity concentration profile.

References Cited

UNITED STATES PATENTS

| | | | |
|---|---|---|---|
| 3,366,802 | 1/1968 | Hilbiber | 307—251 |
| 3,380,153 | 4/1968 | Husher | 29—577 |
| 3,335,341 | 8/1967 | Lin | 317—235 |

OTHER REFERENCES

Roosild, S., "A Unipolar Structure Applying Lateral Diffusion," Proceedings of the I.E.E.E. July 1963, pp. 1059–1060.

JOHN W. HUCKERT, *Primary Examiner.*

M. EDLOW, *Assistant Examiner.*

U.S. Cl. X.R.

307—304